(12) United States Patent
Ramirez-Iniguez et al.

(10) Patent No.: US 9,910,253 B2
(45) Date of Patent: Mar. 6, 2018

(54) OPTICAL ELEMENT

(71) Applicant: UNIVERSITY COURT OF GLASGOW CALEDONIAN UNIVERSITY, Glasgow (GB)

(72) Inventors: Roberto Ramirez-Iniguez, Glasgow (GB); Firdaus Muhammad Sukki, Glasgow (GB); Brian Stewart, Glasgow (GB); Scott McMeekin, Glasgow (GB)

(73) Assignee: University Court of Glasgow Caledonian University, Glasgow (GB)

( * ) Notice: Subject to any disclaimer, the term of this patent is extended or adjusted under 35 U.S.C. 154(b) by 31 days.

(21) Appl. No.: 14/364,236

(22) PCT Filed: Dec. 21, 2012

(86) PCT No.: PCT/GB2012/053239
§ 371 (c)(1),
(2) Date: Jun. 10, 2014

(87) PCT Pub. No.: WO2013/093502
PCT Pub. Date: Jun. 27, 2013

(65) Prior Publication Data
US 2014/0345689 A1 Nov. 27, 2014

(30) Foreign Application Priority Data
Dec. 22, 2011 (GB) .................................. 1122136.3

(51) Int. Cl.
*G02B 19/00* (2006.01)
*H01L 31/0232* (2014.01)
(Continued)

(52) U.S. Cl.
CPC ............ *G02B 19/0028* (2013.01); *F24J 2/08* (2013.01); *G02B 19/0042* (2013.01);
(Continued)

(58) Field of Classification Search
CPC . G02B 19/0028; G02B 19/0042; G06F 17/50; H01L 31/0543; H01L 41/0547;
(Continued)

(56) References Cited

U.S. PATENT DOCUMENTS 4,240,692 A 12/1980 Winston
6,037,535 A 3/2000 Yoshino
(Continued)

FOREIGN PATENT DOCUMENTS

EP 1998102 A1 12/2008
GB 2400452 A 10/2004
(Continued)

OTHER PUBLICATIONS

Ning, X., et al., "Dielectric Totally Internally Reflecting Concentrators", Applied Optics, Jan. 15, 1987, pp. 300-305, vol. 26, No. 2, Optical Society of America, USA.
(Continued)

*Primary Examiner* — Bumsuk Won
*Assistant Examiner* — Wen Huang
(74) *Attorney, Agent, or Firm* — Alston & Bird LLP

(57) ABSTRACT

An optical element and associated methods for generating an optical element and apparatus comprising the optical element, wherein the optical element comprises a first surface (10), a second surface (15), and a side wall structure (25) between the first and second surfaces. The side wall structure has an internally reflecting profile such that optical radiation incident on the first surface at an angle less than or equal to an acceptance angle and then incident on the side wall structure is internally reflected to the second surface by the side wall structure. In a first cross section of the optical element, the side wall structure has a first internally reflecting profile and/or the first surface has a first cross sectional profile. In a second cross section that is rotated relative to the
(Continued)

first cross section, the side wall structure has a second internally reflecting profile and/or the first surface has a second cross sectional profile, wherein the second internally reflecting profile of the side wall structure and/or the second cross sectional profile of the first surface is different from the first internally reflecting profile of the side wall structure and/or the first cross sectional profile of the first surface.

10 Claims, 11 Drawing Sheets

(51) Int. Cl.
G06F 17/50 (2006.01)
H01L 31/054 (2014.01)
F24J 2/08 (2006.01)

(52) U.S. Cl.
CPC ........ G06F 17/50 (2013.01); H01L 31/02325 (2013.01); H01L 31/0543 (2014.12); H01L 31/0547 (2014.12); Y02E 10/40 (2013.01); Y02E 10/52 (2013.01)

(58) Field of Classification Search
CPC ....... H01L 31/02325; F24J 2/08; Y02E 10/40; Y02E 10/52
USPC .......... 359/853, 599, 851, 869; 362/19, 298, 362/555; 385/133; 398/130, 138
See application file for complete search history.

(56) References Cited

U.S. PATENT DOCUMENTS

| 2006/0262399 A1* | 11/2006 | Green ................. G02B 27/28 |
| | | 359/485.02 |
| 2009/0114280 A1 | 5/2009 | Jensen et al. |
| 2010/0269886 A1 | 10/2010 | Argentar |
| 2011/0168260 A1 | 7/2011 | Gleckman |

FOREIGN PATENT DOCUMENTS

| GB | 2475457 A | 5/2011 |
| JP | 08-062039 A | 3/1996 |
| WO | WO 2002/021734 A1 | 3/2002 |
| WO | WO 2010/026415 A2 | 3/2010 |
| WO | WO 2010/105247 A1 | 9/2010 |
| WO | WO 2011/053387 A1 | 5/2011 |

OTHER PUBLICATIONS

Muhammad-Sukki, F., et al., "Optimised Dielectric Totally Internally Reflecting Concentrator for the Solar Photonic Optoelectronic Transformer System: Maximum Concentration Method", Knowledge-Based and Intelligent Information and Engineering Systems, Sep. 8, 2010, pp. 633-641, Springer Verlag, Germany.
Intellectual Property Office, Combined Search and Examination Report for Application No. GB1122136.3, dated Sep. 27, 2012, 8 pages, UK.
International Searching Authority, International Search Report and Written Opinion for International Application No. PCT/GB2012/053239, dated Nov. 14, 2013, 18 pages, European Patent Office, Netherlands.

* cited by examiner

OPTICAL ELEMENT

CROSS REFERENCE TO RELATED APPLICATIONS

This application is a National Stage Application, filed under 35 U.S.C. § 371, of International Application No. PCT/GB2012/053239, filed Dec. 21, 2012, which claims priority to Great Britain Application No. 1122136.3, filed Dec. 22, 2011; the contents of both of which are hereby incorporated by reference in their entirety.

BACKGROUND

Related Field

The present invention relates to an optical element, such as a concentrator lens for a system using solar energy. The present invention also relates to associated methods of generating and producing an optical element and/or solar collection or energy apparatus comprising the optical element.

Description of Related Art

Optical concentrator elements may be utilised in a variety of applications, but are particularly useful in systems that operate using solar radiation, such as solar power, heating and/or lighting systems.

For example, in a photovoltaic system, the cost of the photovoltaic material generally contributes significantly to the overall cost of the system. Furthermore, although more modern photovoltaic materials such as GaAs may be more efficient than traditional amorphous silicon materials, the efficiency of photovoltaic materials is often low, typically being less than 20% and may be even less than 10% efficient. However, the most efficient photovoltaic materials also tend to be the most expensive, increasing the unit cost even further. As such, providing solar concentrators, which act as lenses, collecting incident light over a wide area and concentrating the light onto smaller photovoltaic cells, can significantly increase the overall efficiency of the system.

One example of a system that uses solar concentrators is the system described in WO2010026415. In this system, a solar concentrator has an entry aperture, opposing compound hyperbolic or parabolic sides and a rear surface. With this concentrator, light that is incident on the entry aperture at an angle less than or equal to an acceptance angle with respect to the optical axis is totally internally reflected from one or both of the opposing sides of the concentrator to the rear surface. A photovoltaic cell is provided at the rear surface, wherein the photovoltaic cell is shaped and sized to correspond to the rear surface.

The entry aperture of the concentrators used in the above system is lenticular and is formed to be larger than the rear surface. In this way, the entry aperture accepts light from a wide area. As a result, either the total area of photovoltaic material can be reduced (and thereby the cost), whilst achieving the same performance or the amount of photovoltaic material may stay the same and the performance increased over a non-concentrator system.

There are various techniques for producing such lenses. For example, ray tracing may be used in order to generate an optimum cross sectional side profile for given conditions.

It is at least one objected of one embodiment of the present invention to provide an improved optical concentrator.

BRIEF SUMMARY

According to a first aspect of the present invention is an optical element having a first surface, a second surface, and a side wall structure between the first and second surfaces, wherein the side wall structure has an internally reflecting profile such that optical radiation incident on the first surface at an angle less than or equal to an acceptance angle and then incident on the side wall structure is internally reflected to the second surface by the side wall structure, wherein, in a first cross section of the optical element, the side wall structure has a first internally reflecting profile and/or the first surface has a first cross sectional profile, and in a second cross section that is rotated relative to the first cross section, the side wall structure has a second internally reflecting profile and/or the first surface has a second cross sectional profile, wherein the second internally reflecting profile of the side wall structure and/or the second cross sectional profile of the first surface is different from the first internally reflecting profile of the side wall structure and/or the first cross sectional profile of the first surface.

The optical element may be, for example, an optical concentrator or a lens or an optically dispersive element.

The optical element may be a solid optical element and may be formed from a substantially optically transparent material, which may be a dielectric material.

The side wall structure may have a totally internally reflecting profile, wherein any optical radiation incident on the first surface at an angle less than or equal to an acceptance angle and thereafter incident on the side wall structure is totally internally reflected to the second surface by the side wall structure. Preferably the first and second internally reflecting profiles are totally internally reflecting profiles.

The first and second surfaces may comprise faces or surfaces of the optical element that are configured to accept light into or emit light from the optical element.

The first surface may comprise a front surface or entrance aperture for receiving or emitting radiation. Preferably the system is an optical system and the radiation is radiation from the visible spectrum. However, alternatively or additionally, the radiation may comprise radiation from other parts of the spectrum, such as infra-red radiation.

Cross sectional profiles of the first surface may be curved, such as a section of a circle or a hyperbolic or parabolic section. The first surface may be convex or lenticular. A curvature and/or height of the first surface in the first cross section may be different from a curvature and/or height of the first surface in the second cross section.

The first surface may be configured to refract optical rays that are incident on the first surface to the peripheral wall structure.

The second surface may comprise a rear surface or exit aperture for permitting optical radiation to exit the optical element.

The acceptance angle may be an angle of incident light relative to the optical axis of the optical element and/or an axis running through the centre of the first and second surfaces, wherein light that is incident on the first surface at an angle that is less than or equal to the acceptance angle and subsequently incident on the side wall structure will be internally reflected by the side wall structure to the second surface, whilst at least some of the light that is incident on the first surface at an angle greater than the acceptance angle will pass through the side wall structure.

An acceptance angle of the optical element in the first cross section may differ to the acceptance angle of the optical element in the second cross section.

The second cross section may be rotated around a rotation axis relative to the first cross section. The rotation axis may be the optical axis of the optical element and/or an axis passing substantially through the centres of the first and second surfaces.

In each of a plurality of subsequent cross sections of the optical element, such as third, fourth and/or fifth cross sections, the side wall structure may have a totally internally reflecting profile and/or first surface profile that is different from the totally internally reflecting profile and/or first surface profile of at least two other cross sections of the optical element and preferably each other cross section of the optical element. Each of the subsequent cross sections may be rotated at a rotation angle from a preceding cross section, such as the first, second or another subsequent cross section.

Each of the cross sections of the optical element may comprise a planar cross section extending in a longitudinal direction through the first and second surfaces and containing the optical axis and/or an axis passing through the centres of the first and second surfaces.

For any of the above cross sections of the optical element, the cross section may comprise two opposing side wall profiles, which may be mirror images of each other, i.e. one of the opposing side wall profiles may be rotated 180° around the optical axis of the concentrator element to be superimposed on the opposing side wall profile.

Each side wall profile of each cross section may comprise a plurality of portions and preferably may comprise two portions. Each side wall profile may comprise a first portion closer to the first surface and a second portion closer to the second surface. The first portion may be of a first form and/or be described by a first function and the second portion may be of a second form and/or be described by a second function that differs from the first form and/or function. The first and second portions may be continuous with each other, i.e. the profiles of the first and second portions form a smooth transition with no discontinuities.

The first portion may be shaped such that extreme optical rays that are incident on the front surface within the acceptance angle and subsequently impinge on the first portion are directed to a peripheral or edge point on the rear surface after a single total internal reflection from the first portion.

The second portion may be shaped such that extreme optical rays that are incident on the front surface within the acceptance angle and that subsequently impinge on the second portion are directed to the rear surface. The second portion may be shaped such that the rays exit from the rear surface in parallel.

The second portion may be shaped such that extreme optical rays that are incident on the front surface within the acceptance angle and that subsequently impinge on the second section of the side wall profile are directed to the rear surface such that all rays experience a single total internal reflection before arriving at the rear surface, which may be without any restriction on exit angle or incident angle.

The side profile sections may be determined using a ray tracing method.

The front surface or entrance aperture may be optimised in two or more axes of collection of light.

The optical element may be non-concentric. The optical element may be sector symmetrical. The front surface or entrance aperture may comprise a plurality of sectors, which may comprise an even number of sectors. The sectors may comprise an independent or differing radius of curvature. At least two of the sectors may be symmetrical. The front surface or entrance aperture may comprise a plurality of peaks and troughs and/or curve intersections According to a second aspect of the present invention is a method of generating an optical element, the optical element having a first surface, a second surface, and a side wall structure between the first and second surfaces, wherein the side wall structure has an internally reflecting profile wherein optical radiation incident on the first surface at an angle less than or equal to an acceptance angle and is subsequently incident on the side wall structure is totally internally reflected to the second surface by the side wall structure and the method comprises:

determining a first internally reflecting profile of the side wall structure and/or a first cross sectional profile of the first surface in a first cross section of the optical element;

determining a second internally reflecting profile of the side wall structure and/or a second cross sectional profile of the first surface in a second cross section that is rotated relative to the first cross section, wherein the first internally reflecting profile of the side wall structure and/or the first cross section of the first surface is different to the second internally reflecting profile of the side wall structure and/or the second cross section of the first surface.

The first surface may be a front surface for receiving optical radiation.

The second surface may be a rear surface for permitting optical radiation to exit the optical element.

The optical element may be an optical element as described above in relation to the first embodiment.

The method may comprise determining a front surface arc angle.

The method may comprise determining the side profile sections using a ray tracing method.

One or more dimensions $d_o$ of the rear surface may be selected to correspond to one or more dimensions of a photovoltaic cell that will be located at the rear surface, which may comprise a length and a width of the photovoltaic cell. The method may comprise determining a value of a change $\Delta d_o$ in one or more dimensions of the rear surface.

The method may comprise increasing an angle of rotation, which may be by an arbitrary amount. A new value of an exit diameter (e.g. length and/or width of the photovoltaic cell) may be determined, e.g. using Pythagoras' theorem and the new angle of rotation.

The rear surface may extend in a plane defined by a first and second Cartesian axes, such as x and z axes. The optical axis of the optical element may extend along or parallel to the y-axis. The origin of the Cartesian x, y and z axes may be at the centre of the rear surface.

The method may comprise inputting a desired acceptance angle $\theta_{a-1}$ for the first axis and a desired acceptance angle $\theta_{a-2}$ for the second axis. The method may comprise limiting an acceptance angle for the first axis to be within the range $\pm\theta_{a-1}$ and limiting an acceptance angle for a second axis to be within the range $\pm\theta_{a-2}$.

The method may comprise varying an initial or trial acceptance angle by increasing the initial or trial acceptance angle by a selected acceptance angle variation amount for a first quadrant defined by the +x and +z axes and for a third quadrant defined by the −x and −z axes and by decreasing the trial acceptance angle by the acceptance angle variation amount for a second quadrant defined by the −x and +z axes and for a fourth quadrant defined by the +x and −z axes if the desired acceptance angle for the first (x) axis is less than the desired acceptance angle for the second (z) axis.

The method may comprise varying a trial acceptance angle by decreasing the trial acceptance angle by a selected acceptance angle variation amount for the first quadrant defined by the +x and +z axes and for the third quadrant defined by the −x and −z axes and by increasing the trial acceptance angle by the acceptance angle variation amount for the second quadrant defined by the −x and +z axes and for the fourth quadrant defined by the +x and −z axes if the desired acceptance angle for the first (x) axis is greater than the desired acceptance angle for the second (z) axis.

The method may comprise determining a cross sectional profile of the optical element, which may be, for example, the first cross section, the second cross section or at least one subsequent cross section, which may be calculated based on input trial variables and/or fixed parameter values. Examples of trial variables may include at least one of the total height of the concentrator, the trial front surface arc angle, the trial length of the front surface and/or the number of extreme rays. Examples of fixed parameter values may include at least one of the acceptance angle at x-axis, the acceptance angle at z-axis, the index of refraction of the dielectric, the length of the PV cell and/or the width of the PV cell. The initial input variables may be provided by a user. An initial acceptance angle may be equal to the desired acceptance angle for the first axis.

Any of the above cross sectional profiles of the optical element may be determined using ray tracing.

The method may comprise determining a profile of a first portion of the side wall structure in any of the above cross sections such that extreme optical rays that are incident on the front surface within the acceptance angle and are subsequently incident on the first portion are reflected to a peripheral point on the rear surface after a single total internal reflection from the first portion.

Preferably, the method may comprise determining a profile of a second portion of the side wall structure in any of the above cross sections such that extreme optical rays that are incident on the front surface within the acceptance angle and that are subsequently incident on the second portion are directed to the rear surface. The profile of the second portion of the side wall structure may be determined such that the rays exit in parallel.

The first portion may be closer to the first or front surface than the second portion.

Optionally, the method may comprise determining a profile of a second portion of the side wall structure in any of the above cross sections such that all the rays entering the first surface within the acceptance angle that are subsequently incident on the second portion experience a single total internal reflection from the side wall structure and arrive at the second surface, which may be without restricting the exit angle and the incident angle.

The method may comprise calculating a trial total height of the optical element. The calculation may take into account a number of extreme rays entering the optical element at the critical angle.

The method may comprise comparing the entrance aperture diameter generated by the ray tracing method with the trial entrance aperture diameter, e.g. the entrance aperture diameter corresponding to the initial input variables or the entrance aperture diameter from a previously determined cross sectional profile. The method may comprise determining a new entrance aperture diameter from the difference between the preceding trial entrance aperture diameter and the generated entrance aperture diameter. The method may comprise iteratively determining a new cross sectional profile of the optical element for the first cross section based on the new trial entrance aperture diameter determined from the difference of the input aperture profile and the generated entrance aperture diameter from the previous iteration until the difference between the input entrance aperture diameter and the generated entrance aperture diameter is less than a threshold.

The determination of the profile of the optical element in the second cross section may comprise varying the initial acceptance angle and/or at least one dimension of the second surface, such as a diameter, relative to the first cross section.

The method may comprise determining the profile of at least one further cross section. The further cross section(s) may be rotated around the optical and/or y axis relative to the first and/or second and/or at least one further cross section, wherein the rotation may optionally be by a predetermined amount. The determination of the profile of the at least one further cross section may comprise varying the initial acceptance angle and/or at least one dimension, such as the diameter, of the second surface relative to a preceding cross section, such as the first, second or a further cross section. Other method steps used to determine the profile of the at least one further cross section may be similar to those used to determine the profile of the first and second cross sections.

The method may comprise determining profiles of further cross sections that are rotated around the optical and/or y axis relative to a preceding cross section. The further cross sections may be generated until a 180° rotation has been performed relative to the first cross section. The further cross sections may be generated until a 90° rotation has been performed relative to the first cross section and a mirror image operation may be performed on two orthogonal axes in order to generate a 3D model of the optical element.

At least two, preferably a plurality and most preferably each of the first, second and at least one further cross sections may have a different surface arc angle of the front surface and/or a different first side wall profile and/or a different second side wall profile and/or a different acceptance angle relative to at least one and preferably each of the other of the first, second and at least one further cross sections.

The method may comprise an iterative process. The method may comprise evaluating one or more cross sections of the optical element using one or more parameters and/or conditions used to generate another, different, previous and/or subsequent cross section of the optical element, which may comprise a feed forward and/or feed back process. The cross sections may be different cross sections, e.g. rotated with respect to one another.

According to a third aspect of the invention is an optical element produced using the method of the second aspect.

The optical element may be, for example, an optical concentrator, a lens or an optically dispersive element.

The optical element may comprise at least one feature described in relation to, the first and/or second aspects of invention.

According to a fourth aspect of the present invention is a method of manufacturing an optical element, comprising generating an optical element using the method of the second aspect of invention, and generating instructions for producing the optical element.

The instructions may represent instructions for programming or controlling a production apparatus. The method of manufacturing may comprise providing the instructions to the production apparatus. The production apparatus may be operable to produce an optical element, such as an optical element according to the first aspect. The production apparatus may be configured to produce a mould, former or other shaping apparatus for producing an optical element. The method of manufacturing may comprise producing an optical element according to the instructions, which may be an optical element according to the first aspect of invention. The method of manufacturing may comprise producing a mould, former or other shaping apparatus for producing an optical element and the method may optionally comprise producing an optical element using the mould, former or other shaping apparatus. The production apparatus may comprise, for example, computer numerical control (CNC) based apparatus and/or extrusion apparatus and/or moulding apparatus. The production apparatus may comprise diamond turning apparatus and/or rapid prototyping apparatus.

According to a fifth aspect of the present invention is a solar energy generation or collection apparatus comprising an optical element according to the first or third aspects, wherein the optical element is configured to act as an optical concentrator.

The apparatus may comprise, for example, a solar electric generator, an optical light source or light pipe, a solar heater, such as a water or other fluid heater or a space heater, or any combination of the above.

The apparatus may comprise a photovoltaic cell provided at the rear surface. The rear surface may have dimensions corresponding to the dimensions of the photovoltaic cell.

The apparatus may comprise a plurality of optical concentrators and/or photovoltaic cells, which may be arranged in an array.

At least two and preferably each of the optical concentrators may be arranged such that at least part and preferably substantially all of the light that is not reflected by the side wall structure is received by another optical concentrator of the array.

At least one and preferably each optical concentrator of the array may be staggered in an optical axis direction relative to at least one other optical concentrator of the array. The array may be a three dimensional array.

Light that is incident on the entry aperture out with the acceptance angle may pass through one of the opposing side walls and can be used, for example, as lighting. Fluid used to cool the system may be utilised for domestic hot water or used in heating applications.

The solar energy apparatus may comprise an array having at least one feature described in WO2010026415, which is hereby incorporated by reference.

According to a sixth aspect of the present invention is sensor or detector system comprising at least one optical element of the first aspect and/or produced using the method of the second aspect and at least one sensor or detector, wherein at least one of the sensors or detectors is configured to receive radiation from at least one optical element.

In this way, the radiation concentrating properties of the optical element may be used to increase the radiation received by the sensor or detector and thereby improve the sensitivity of the system without necessarily increasing the number, area or complexity of the sensor(s).

The sensor or detector may be configured to receive radiation from the second surface of the optical element, for example, the sensor or detector may be provided at or adjacent the second surface.

It will be appreciated that the sensor may comprise any suitable radiation sensor known in the art, such as but not limited to, CCD devices, CMOS devices, photodiodes, photochromic devices, photographic paper, photon multipliers, ionising detectors or the like.

The sensor or detector system may comprise or be comprised in a fluorescence sensing apparatus. The fluorescence sensing apparatus may be configured for use in, for example, medical, biological, water treatment and/or condition monitoring and the like.

The sensor or detector system may comprise or be comprised in a thermal sensing apparatus. The thermal sensing apparatus may be configured for use in, for example, medical, biological, water treatment, security systems, thermal imaging systems, condition monitoring systems, motion sensors (e.g. PIR sensors) and the like.

The sensor or detector system may comprise or be comprised in a spectroscopy system. The sensor or detector apparatus may comprise or be comprised in a telescope/telescopic system and or other astronomy apparatus.

According to a seventh aspect of the present invention is an optical communication system comprising an optical element according to the first aspect and/or produced using the method of the second aspect.

The optical element may comprise, be comprised in or function as a beam shaper.

The optical communication system may comprise a transmitter. The optical element may be comprised in the transmitter, for example, to act as a beam shaper for the transmitter.

The optical communications system may comprise a receiver. The optical element may be comprised in the receiver. For example, the concentrating properties of the optical element may be configured to improve the signal received by the receiver. The receiver may comprise sensor or detector apparatus according to the sixth aspect of invention.

According to an eighth aspect of the present invention is a transmitter or projector comprising an optical element according to the first aspect and/or produced using the method of the second aspect.

The transmitter or projector may comprise a radiation source, such as a light source, and the optical element may be configured to receive radiation from the radiation source. The optical element may be arranged such that the second surface of the optical element receives the radiation from the radiation source such that the optical element acts as a light dispersing element. Alternatively, the first surface of the optical element may be arranged to receive the radiation from the radiation source, for example, such that the optical element is operable as a beam shaper.

The transmitter or projector apparatus may be configured to distribute and/or project light of a single or multiple colours from the light source or light sources.

In general, it will be appreciated that the optical element of the first aspect may be used in any suitable application that requires collection of low intensity signals or where increasing the intensity of signals would be advantageous, for example, in order to enhance detection sensitivity.

According to a ninth aspect of the present invention is an optical imaging system comprising at least one optical element according to the first aspect and/or produced using the method of the second aspect.

The optical imaging system may comprise a light source.

The optical imaging system may comprise an array of optical elements according to the first aspect and/or produced using the method of the second aspect. The optical elements may comprise directive concentrators.

For example, the optical imaging system may be configured to generate pixels of the optical imaging system, such as pixels of an object in a micro structure.

According to a tenth aspect of the present invention is a ventilation system comprising at least one optical element according to the first aspect or produced using the method of the second aspect.

The ventilation system may comprise any of the features of a ventilation system as described by WO2010026415, the teaching of which are hereby incorporated by reference. For example, heat generated by optically concentrating light using the optical elements can be used to drive ventilation, e.g. by creating convection flow, chimney flow or laminar flow.

Features analogous to those described in relation to any of the aspects of invention may also be applicable to any of the other aspects of invention.

Advantages of these embodiments are set out hereafter, and further details and features of each of these embodiments are defined in the accompanying dependent claims and elsewhere in the following detailed description.

BRIEF DESCRIPTION OF THE FIGURES

At least one embodiment of the invention will now be described, by way of example only, with reference to the accompanying drawings, in which.

DETAILED DESCRIPTION OF VARIOUS EMBODIMENTS

Figure 1:
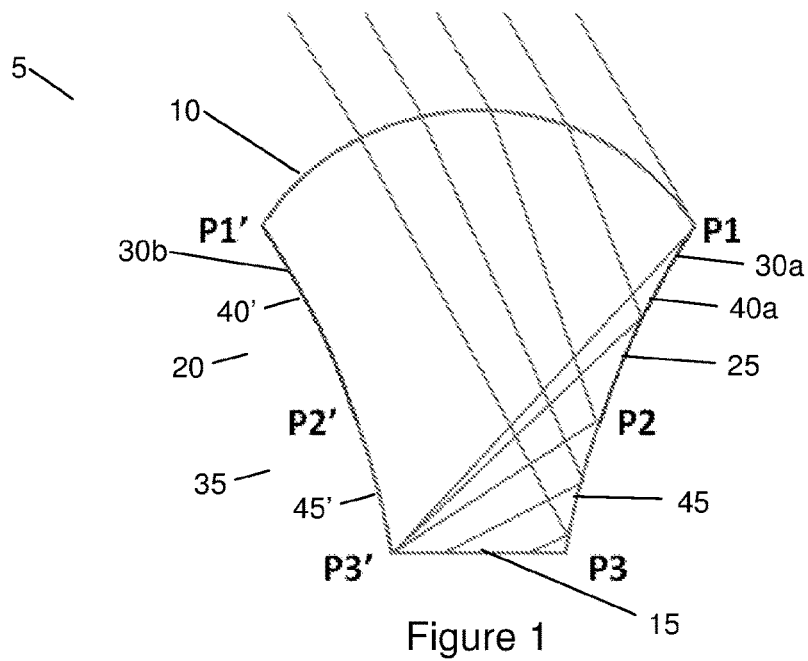
FIG. 1 is a cross section of an optical element according to the invention.

Throughout the following description, identical reference numerals will be used to identify like parts.

Figure 2:
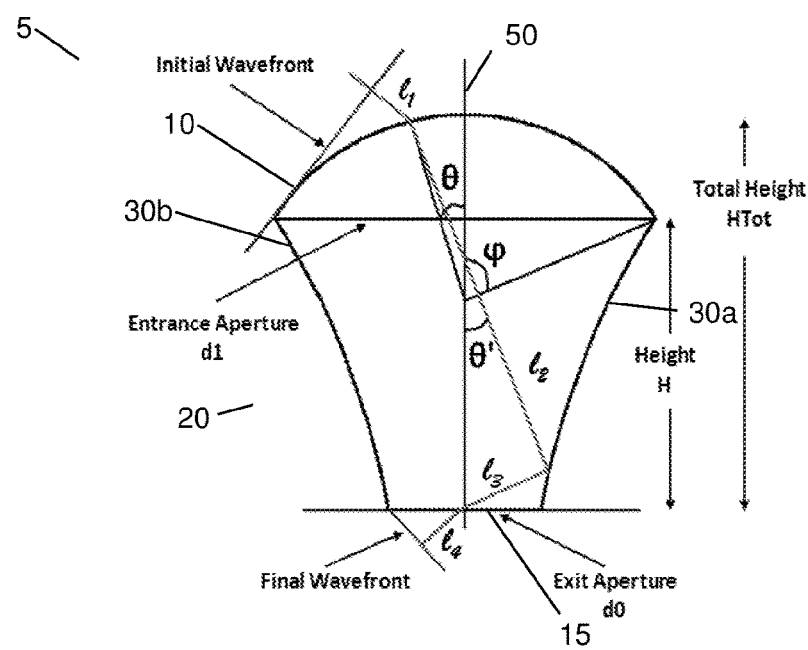
FIG. 2 is a schematic illustration of a method used to generate the cross section of FIG. 1.

FIGS. 1 and 2 illustrate a cross sectional profile of an optical element 5. The optical element 5 is solid and is formed of an optically transparent dielectric material, such as glass, Perspex, quartz, poly methyl methacrylate, polystyrene, polycarbonate or the like. However, in other embodiments, the optical element 5 may comprise a liquid and/or a gas.

The optical element 5 comprises a first surface 10 that acts as a front surface whose cross section extends between points P1 and P1' shown in FIG. 1 and a second surface 15 that acts as a rear surface formed between points P3 and P3'. Intermediate structure 20 having a surface 25 that extends between the front surface 10 and the rear surface 15, i.e. between points P1', P3', P3 and P1 in the cross section. A plane extending directly between the points P1 and P1' at an end of the intermediate structure toward the first surface 10 defines an entrance aperture (d1 in FIG. 2). The diameter of the entrance aperture d1 is larger than the diameter of the rear surface 15.

The front surface 10 comprises a generally convex structure. The front surface 10 in this example has a curved cross section. However, it will be appreciated that the cross section of the front surface 10 may take a different form, such as a parabola, hyperbola or an ellipse. The degree of curvature of the cross section of the front surface 10 in any direction depends on other parameters of the optical element 5 such as the total height and/or refractive index and/or desired acceptance angle.

Cross sections 35 of the intermediate structure comprise two opposing mirror image faces 30a, 30b extending from point P1 to point P3 and from point P1' to P3' respectively. The front surface 10 is configured to refract incident light onto the faces 30a, 30b of the intermediate structure 20. The curvature of the faces 30a, 30b of the cross section 35 of the intermediate structure 20 is such that light that is incident on the front surface 10 at an angle that is equal to or less than an acceptance angle and thereafter incident on the opposing faces 30a, 30b of the intermediate structure 20 is totally internally reflected to the rear surface 15.

Each of the opposing faces 30a, 30b of a cross section of the intermediate structure 20 of the optical element 5 comprise a first portion 40, 40' that is closest to the front surface 10, i.e. the between points P1 and P2 and P1' and P2' respectively, and a second portion 45, 45' that is furthest from the front surface 10 and closest to the rear surface 15, i.e. between points P2 and P3 and P2' and P3' respectively. The first portion 40, 40' of each of the opposing faces 30a, 30b has a different curvature to the second portion 45, 45'. The curvature of the first portion 40, 40' of each opposing face 30a, 30b of the intermediate structure 20 is configured to totally internally reflect extreme light rays that are incident on the front surface 10 at the acceptance angle and that are subsequently incident on the first portion 40, 40' to an opposing edge of the rear surface 15 after a single total internal reflection, i.e. the extreme light rays incident on portion P1 to P2 are totally internally reflected directly to point P3', whilst the extreme rays that are incident on portion P1' to P2' are totally internally reflected directly to point P3.

The curvature of the second portion 45, 45' of each opposing face 30a, 30b of the cross section 35 of the intermediate structure 20 is such that light rays that are incident on the front surface 10 at an angle less than or equal to the acceptance angle and are then incident on the second portion 45, 45' of one of the opposing faces 30a, 30b of the cross section 35 of the intermediate structure 20 are totally internally reflected to the rear surface 15.

The conditions for doing this vary depending on the design method used to generate the profiles of the optical element cross sections 35. Two examples of suitable methods are a maximum concentration method and a phase conservation method.

In the maximum concentration method, the curvature of the second portion 45, 45' of each opposing face 30a, 30b is determined such that all the incident rays within the acceptance angle that are incident on the second portion 45, 45' will experience a single total internal reflection from the second portion 45, 45' before arriving at the rear surface 15, without restricting the exit angle and the incident angle. This results in a high concentration. With the phase conservation method, the curvature of the second portion 45, 45' is determined such that the incident rays at the acceptance angle that are subsequently incident on the second portion 45, 45' are totally internally reflected by the second portion 45, 45' to the rear surface 15 such that they reach the rear surface 15 in parallel. This method results in the rays exiting the optical element 5 with a well-defined wavefront.

The profiles of the opposing faces 30a, 30b of the intermediate portion 20 in any cross section 35 of the optical element 5 are generated using a ray tracing method that makes use of the models outlined below.

According to Snell's law, any light travelling through two media of different refractive indices at an angle greater than the critical angle $\theta_c$ will be reflected back to the area with a higher refractive index. The critical angle can be determined using the following relations:

$$\theta_c \sin^{-1}\left(\frac{n_1}{n_2}\right) \text{ for } n_1 < n_2 \quad \text{(Equation 1-1a)}$$

$$\theta_c = \sin^{-1}\left(\frac{n_2}{n_1}\right) \text{ for } n_1 > n_2 \quad \text{(Equation 1-1b)}$$

Where $n_1$ and $n_2$ are the refractive indexes of the materials on either side of the interface (e.g. the material of the optical element and air).

For any light passing through the optical element 5, the different parts of the optical path can be represented as $l_1$, $l_2$, $l_3$ and $l_4$, as shown in FIG. 2. In FIG. 2, $l_1$ is the part of the optical path before it intersects with the front surface 10, $l_2$ is the section of the optical path between the front surface 10 and the first intersection with a face 30a, 30b of the intermediate structure 20, $l_3$ is the part of the optical path between the face 30a, 30b of the intermediate structure 20 and the rear surface 15 and $l_4$ is the section of the optical path after exiting the rear surface.

The Fermat principle states that the optical path length C of the light must be the same. Therefore:

$$C = l_1 + n(l_2 + l_3 + l_4) \quad \text{(Equation 1-2)}$$

The cross sectional design requires five input parameters, namely the acceptance angle $\theta_a$, the front surface arc angle $\phi$, the entrance diameter $d_1$, the exit diameter $d_0$ and the index of refraction n of the material from which the optical element 5 is formed.

As can be seen from FIG. 2, the radius of an arc of the front surface 10 can be described in terms of the front surface arc angle $\phi$, and the entrance diameter $d_1$ which is shown below:

$$R = d_1/(2 \sin \phi) \quad \text{(Equation 1-3)}$$

The front surface arc angle $\phi$ is the angle between the y axis of the concentrator at the origin of the curve of the front surface 10 and the line created by the intersection between the front surface 10 and the intermediate portion 20 of the optical element 5 to the origin of the curve.

A ray that hits the front of the front surface 10 at an angle $\theta$ to the optical axis 50 of the optical element 5 will exit the curved front surface 10 with an angle $\theta'$ relative to the vertical axis, wherein $\theta'$ can be determined using:

$$\theta' = \sin^{-1}\left[\frac{\sin(\theta + \theta_a)}{n}\right] - \theta \quad \text{(Equation 1-4)}$$

Where n is the index of refraction of the material from which the optical element 5 is formed and $\theta_a$ is the acceptance angle.

The optical path length of $l_1$ is given by:

$$l_1 = 2R\sin^2\left(\frac{\theta + \theta_a}{2}\right) \quad \text{(Equation 1-5)}$$

where R is the radius of curvature of the front surface 10.

In order for the rays to experience a single total internal reflection before arriving at the rear surface 15, a ray from P1 must be directed to P3', as shown in FIG. 1. From this, the height, H of the cross section 35 of the optical element 5 can be calculated. H is the shortest distance between the top of the intermediate structure 20 and the rear surface 15, i.e. from P1 to the base of the optical element 5. By using equation 1-4, the maximum value of $\theta'$ can be expressed as:

$$\Theta = \max(\theta') = \sin^{-1}\left[\frac{\sin(\theta_a - \varphi)}{n}\right] + \varphi$$

H can be written in terms of the diameters $d_1$ and $d_o$ of the entrance 10 and exit 15 apertures, and the maximum angle $\Theta$ using a simple trigonometric function shown below:

$$\tan \Theta = \frac{(d_1 + d_0)}{2H}$$

Rearranging the equation, we get:

$$H = \tfrac{1}{2}(d_1 + d_0)\cot \Theta \quad \text{(Equation 1-6)}$$

The optical path length C required for incident light to experience a single total internal reflection before arriving at the rear surface 15 can determined by considering the situation where $l_3 = l_4 = 0$. In this case, C can be written as:

$$C = l_1 + n l_2 \quad \text{(Equation 1-7)}$$

By substituting equation 1-5 into equation 1-7, we get $$C = 2R\sin^2\left(\frac{\theta + \theta_a}{2}\right) + n l_2$$

From equation 1-6, $l_2$ can be solved and rewritten terms of the diameters of the entrance 10 and exit 15 apertures $d_1$, $d_0$ and the incident angle of the light $\theta$, as indicated below:

$$l_2^2 = \left(\frac{1}{2}(d_1 + d_0)\right)^2 + H^2$$

$$= \left(\frac{d_1 + d_0}{2}\right)^2 + \left[\left(\frac{d_1 + d_0}{2}\right)\cot\theta\right]^2$$

$$= \left(\frac{d_1 + d_0}{2}\right)^2 \left[1 + \left(\frac{\cos^2\theta}{\sin^2\theta}\right)\right]^2$$

$$= \left(\frac{d_1 + d_0}{2}\right)^2 \left(\frac{1}{\sin^2\theta}\right)$$

$$l_2 = \sqrt{\left(\frac{d_1 + d_0}{2}\right)^2 \left(\frac{1}{\sin^2\theta}\right)} = \frac{d_1 + d_0}{2\sin\theta}$$

Solving this for C gives:

$$C = 2R\sin^2\left(\frac{\theta_a + \varphi}{2}\right) + n\frac{d_1 + d_0}{2\sin\Theta} \quad \text{(Equation 1-8)}$$

It is one of the conditions of this method that rays (that were originally within the acceptance angle) that hit the portion of the face 30a, 30b of the intermediate structure 20 between P1 and P2, will be directed to P3'. In this case, $l_4=0$. Here, there will be three unknowns $l_2$, $l_{3X}$ and $l_{3y}$ that need to be solved. There are three equations that can be derived to solve the three unknowns which can be derived from the optical path length and the geometry of the cross section of the optical element, the three equations being as follows:

Optical path length, C: $C = l_1 + n\left[l_2 + (l_{3x}^2 + l_{3y}^2)^{\frac{1}{2}}\right]$ (Equation 1-9)

Height, H: $H = l_2\cos(\theta') + l_{3y} - R[\cos(\theta) - \cos(\varphi)]$ (Equation 1-10)

Length, L: $R\sin(\theta) + l_2\sin(\theta') - l_{3x} = \frac{-d_0}{2}$ (Equation 1-11)

Rearranging equation 1-9:

$$\frac{C - l}{n} = l_2 + (l_{3x}^2 + l_{3y}^2)^{\frac{1}{2}}$$

$$\left(\frac{C - l_1}{n} - l_2\right)^2 = l_{3x}^2 + l_{3y}^2$$

If $$B = \frac{C - l_1}{n},$$

the equation can be rewritten to become $$(B - l_2)^2 = l_{3x}^2 + l_{3y}^2$$

$$B^2 - 2Bl_2 + l_2^2 = l_{3x}^2 + l_{3y}^2 \quad \text{(Equation 1-12)}$$

Equations 1-10 and 1-11 can be re-written in terms of $l_2$ in order to solve equation 1-12. By substituting $A = \cos(\theta) - \cos(\phi)$ into equation 1-10 and rearranging the equation, $l_{3y}^2$ can be expressed as follows:

$$l_{3y}^2 = (H - l_2\cos(\theta') + RA)^2 = H^2 - 2Hl_2\cos(\theta') + \quad \text{(Equation 1-13)}$$

$$2HRA - 2RAl_2\cos(\theta') + l_2^2\cos^2(\theta') + (RA)^2$$

Similarly, equation 1-11 can be rearranged to get $l_{3x}^2$ in terms of $l_2$.

$$l_{3x}^2 = \left(R\sin(\theta) + l_2\sin(\theta)' + \frac{d_o}{2}\right)^2 = \quad \text{(Equation 1-14)}$$

$$R^2\sin^2(\theta) + 2Rl_2\sin(\theta)\sin(\theta)' + Rd_0\sin(\theta) +$$

$$d_0 l_2\sin(\theta)' + l_2^2\sin^2(\theta)' + \left(\frac{d_0}{2}\right)^2$$

Equations 1-13 and 1-14 are substituted into equation 1-12:

$$B^2 - 2Bl_2 + l_2^2 =$$

$$R^2\sin^2(\theta) + 2Rl_2\sin(\theta)\sin(\theta)' + Rd_0\sin(\theta) + d_0 l_2\sin(\theta)' + l_2^2\sin^2(\theta)' +$$

$$\left(\frac{d_0}{2}\right)^2 + H^2 - 2Hl_2\cos(\theta)' + 2HRA - 2RAl_2\cos(\theta)' + l_2^2\cos^2(\theta)' + (RA)^2$$

Solving this equation:

$$l_2 = \frac{\left(R\sin(\theta) + \frac{d_0}{2}\right)^2 + (H + RA)^2 - B^2}{2(H + RA)\cos(\theta)' - 2\left(\begin{array}{c}R\sin(\theta) + \\ \frac{d_0}{2}\end{array}\right)\sin(\theta)' - 2B} \quad \text{(Equation 1-15)}$$

Equation 1-15 is substituted back into equations 1-13 and 1-14 to get $l_{3x}^2$ and $l_{3y}^2$. From this, the x and y coordinates for points on the first portion 40, 40' can be determined using:

$$x = R\sin(\theta) + l_2\sin(\theta)' \quad \text{(Equation 1-16)}$$

$$y = H - l_2\cos(\theta)' + RA \quad \text{(Equation 1-17)}$$

The profile of the second portion 45, 45' can be determined using a variety of techniques. Two examples of suitable techniques include the Maximum Concentration Method and the preferred Phase Conservation Method.

Maximum Concentration Method

It is a condition of the maximum concentration method that rays that are incident on the front surface 10 that are equal to or less than the acceptance angle and are then incident on the second portion 45, 45' of the intermediate structure 20 will experience a single total internal refection and arrive at the rear surface 15 without restricting the exit angle and the incident angle. This results in the maximum concentration.

Figure 3:
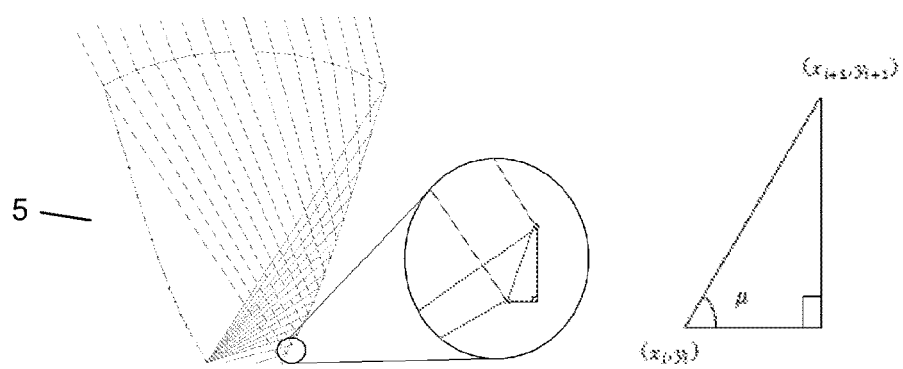
FIG. 3 is a schematic illustration of a method used to generate the cross section of FIG. 1.

The coordinates of the second portion 45, 45' for any given cross section 35 of the intermediate structure 20 can be determined by using a recursive ray tracing method. The starting point of the recursive method can either be at point P2 or point P3. In this embodiment, point P3 is taken as the starting point and is labelled as $(x_i, y_i)$. The next coordinate $(x_{i+1}, y_{i+1})$ is determined by finding the intersection of the next extreme ray with a straight line extending from $(x_i, y_i)$ with such a slope that this ray will just be totally internally reflected. FIG. 3 shows a graphical representation of the recursion process to produce the profile of the second portion 45, 45'.

Given p, the angle of the straight line from $(x_i, y_i)$ to $(x_{i+1}, y_{i+1})$, is equal to $(\theta_c+\theta'_{i+1})$, the relation between the coordinates of a subsequent point $(x_{i+1}, y_{i+i})$ of the second portion 45, 45', the coordinates of a previous point $(x_i, y_i)$ on the second portion 45, 45', and μ can be written as:

$$\tan(\mu) = \frac{y_{i+1} - y_i}{x_{i+1} - x_i} \quad \text{(Equation 2-1)}$$

Rearranging Equation 2-1:

$$y_{i+1}=(x_{i+1}-x_i)\tan(\mu)+y_i \quad \text{(Equation 2-2)}$$

From equations 1-16 and 1-17:

$$x_{i+1}=P\cdot\sin(\theta'_{i+1})+l_2\sin(\theta'_{i+1}) \quad \text{(Equation 2-3)}$$

$$y_{i+1}=H-l_2\cos(\theta'_{i+1})+RA \quad \text{(Equation 2-4)}$$

where $A=\cos(\theta_{i+1})-\cos(\phi)$.

Next, by re arranging equation 2-3, $l_2$ can be expressed as:

$$l_2 = \frac{x_{i+1} - R\sin(\theta_{i+1})}{\sin(\theta'_{i+1})} \quad \text{(Equation 2-5)}$$

Substituting equation 2-5 into equation 2-4, we get:

$$y_{i+1}=H-(x_{i+1}-R\sin(\theta_{i+1}))\cot(\theta'_{i+1})+RA \quad \text{(Equation 2-6)}$$

From equations 2-2 and 2-6, the relation between $(x_i, y_i)$ and $(x_{i+1}, y_{i+1})$ can be shown by using the recursion formula below:

$$x_{i+1} = \frac{H + R\sin(\theta_{i+1})\cot(\theta'_{i+1}) + R\left[\dfrac{\cos(\theta_{i+1}) - }{\cos(\varphi)}\right] - y_i + x_i\tan(\theta_c + \theta'_{i+1})}{\tan(\theta_c + \theta'_{i+1}) + \cot(\theta'_{i+1})} \quad \text{(Equation 2-7)}$$

$$y_{i+1} = (x_{i+1} - x_i)\tan(\theta_c + \theta'_{k+1}) + y_i \quad \text{(Equation 2-8)}$$

Given a starting point on the second portion 45, 45', equations 2-7 and 2-8 may be used to determine the coordinates of the next point on the second portion 45, 45' using a recursive ray tracing technique.

Phase Conservation Method

In preferred embodiments of the invention, the profile of the totally internally reflecting cross section 35 of the optical element 5 may be determined using a phase conservation method. In the phase conservation method, a cross sectional profile 35 is created that will allow the rays to exit in parallel. This enables the rays to exit with a well-defined wave front.

It is a condition of the phase conservation method that all rays that are incident on the front surface 10 within the acceptance angle and that are subsequently incident on the second portion 45, 45', i.e. from P2 to P3 or P2' to P3' of the faces 30a, 30b, are reflected by faces 30a, 30b the so as to arrive at the rear surface 15 with the same exit angle $\theta_o$. The formula of $\theta_o$ is given by:

$$\theta_o=\pi-\Theta-2\theta_c \quad \text{(Equation 3-1)}$$

where $\Theta$ is the maximum value of $\theta'$ and $\theta_c$ is the critical angle, i.e. the angle of incidence above which total internal reflection occurs.

Similarly to maximum concentration method, three unknown component of the optical path $l_2$, $l_3$ and $l_4$ need to be identified. Three equations can be obtained based on the optical path length, the height and the length of the optical element:

Optical path length, $C$: $C = l_1 + n(l_2 + l_3 + l_4)$ (Equation 3-2)

Height, $H$: $H = l_2\cos(\theta') + l_3\cos(\theta_o) - R[\cos(\theta) - \cos(\varphi)]$ (Equation 3-3)

Length: $R\sin(\theta) + l_2\sin(\theta') - l_3\sin(\theta_o) = \dfrac{-d_0}{2} + \dfrac{l_4}{\sin(\theta_o)}$ (Equation 3-4)

Using $B = \dfrac{C - l_1}{n}$, (Equation 3-5)

equation 3-2 can be arranged as: $B = l_2 + l_3 + l_4$

To solve equation 3-5, $l_3$ and $l_4$ can be defined using equations 3-3 and 3-4 as shown below:

$$l_3 = \frac{H - l_2\cos(\theta') + RA}{\cos(\theta_o)} \quad \text{(Equation 3-6)}$$

-continued $$l_4 = \sin(\theta_o)\left[R\sin(\theta) + l_2\sin(\theta') - l_3\sin(\theta_o) + \frac{d_o}{2}\right] \quad \text{(Equation 3-7)}$$

Substituting these two equations into Equation 3-5:

$$B = l_2 + \left[\frac{H - l_2\cos(\theta') + RA}{\cos(\theta_o)}\right] + \left[\sin(\theta_o)\left[R\sin(\theta) + l_2\sin(\theta') - \left[\frac{H - l_2\cos(\theta') + RA}{\cos(\theta_o)}\right]\sin(\theta_o) + \frac{d_o}{2}\right]\right]$$

Solving the above equation gives:

$$l_2 = \frac{B - \left(\dfrac{H + RA}{\cos(\theta_o)}\right) + \sin(\theta_o)\left(H\tan(\theta_o) + RA\tan(\theta_o) - R\sin(\theta) - \dfrac{d_o}{2}\right)}{1 - \dfrac{\cos(\theta')}{\cos(\theta_o)} + \sin(\theta')\sin(\theta_o) + \sin(\theta_o)\cos(\theta')\tan(\theta_o)} \quad \text{(Equation 3-8)}$$

By substituting equation 3-8 into equations 3-6 and 3-7, $l_3$ and $l_4$ can be solved. The x and y coordinate for points of the second portion 45, 45' can then be determined using equations 1-16 and 1-17 (above):

$$x = R\sin(\theta) + l_2 \sin(\theta)' \quad \text{(Equation 1-16)}$$

$$y = H - l_2 \cos(\theta)' + RA \quad \text{(Equation 1-17)}$$

In this way, the profile of the of the second portions 45, 45' of each cross section 35 of the optical element 5 can then be determined for each point x, y using a recursive ray tracing technique.

Generation of a Non-Rotationally Symmetric Optical Element Based on the Totally Internally Reflecting Cross Sections The optical elements 5 are designed to tackle two issues, providing additional gain at another plane of the optical element 5, as well as reducing the size of the photovoltaic cell needed for solar energy generation apparatus, hence reducing the cost of the whole solar system. The optical element 5 is capable of having two or more different acceptance angles $\theta_a$ in different planes, i.e. for different cross sections 35.

The optical element 5 is based on iteratively generating a plurality of dielectric total internally reflecting cross sectional profiles 35 (i.e. 2-D profiles), each of the cross sectional profiles 35 being at a differing angle of rotation about the optic axis 50 of the optical element 5 (thereby resulting in a 3D structure for the optical element 5). The cross sectional profiles 35 of the optical element 5 comprise totally internally reflecting cross sectional profile designs for the intermediate structure 20 as described above and cross sectional profiles of the front surface 10 which are determined so as to result in differing acceptance angles $\theta_a$. New cross sectional profiles 35 are successively generated at incremented rotation angles until a 180° rotation has been performed and a 3D structure for the optical element 5 has been obtained. In an alternative embodiment, new cross sectional profiles 35 are successively generated at incremental rotation angles until a 90° rotation has been performed and the remaining quadrants of the optical element 5 are two mirror images of the determined cross sectional profiles.

Figure 4:
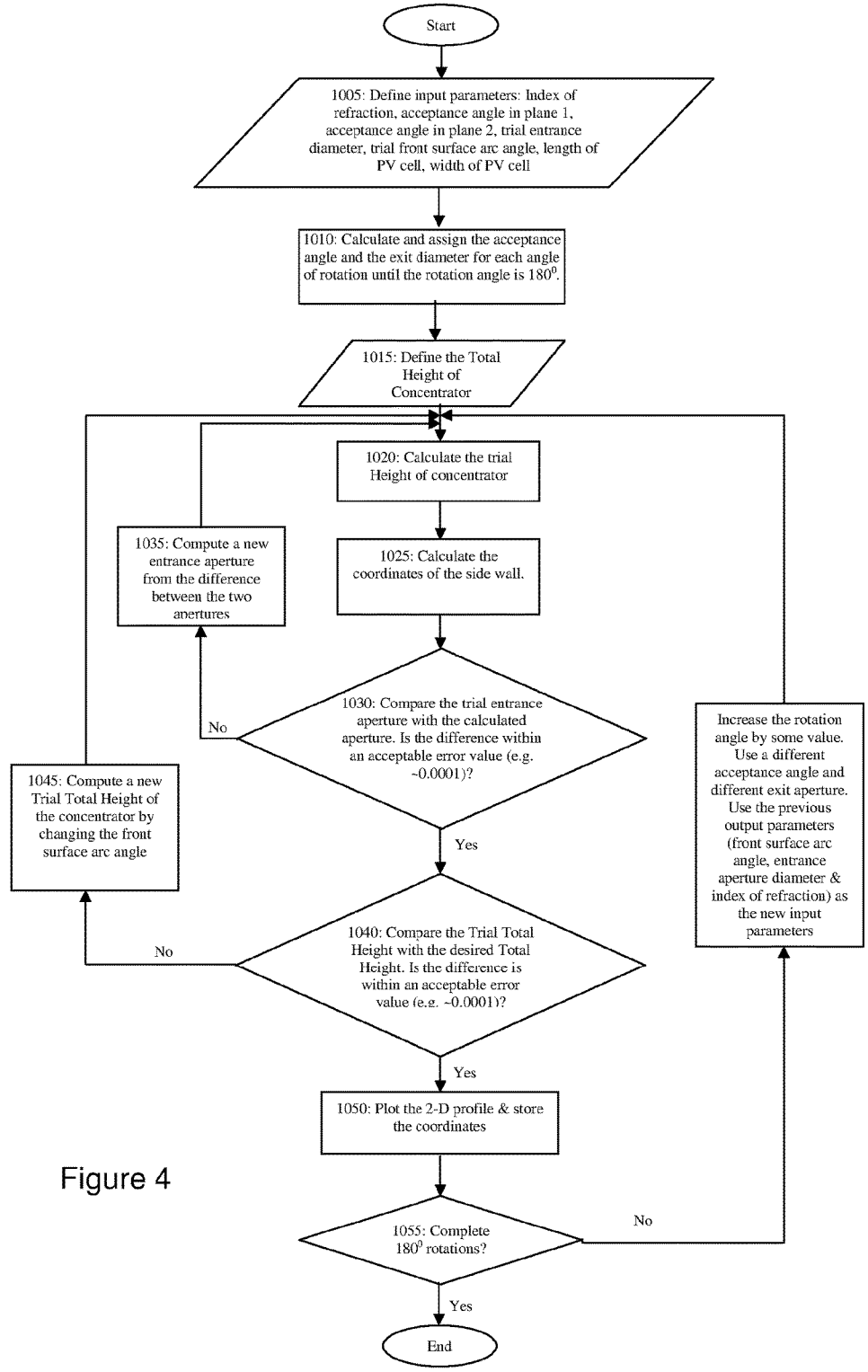
FIG. 4 shows a method of generating an optical element.

The method of generating the optical element is described in terms of a Cartesian coordinate system having x, y and z axes. The process of generating the optical element is shown in FIG. 4.

The design of each cross sectional the optical element requires a number of input parameters (step 1005), which include a total height HTot of the optical element 5 (in step 1015), a trial front surface 10 arc angle ϕ, an acceptance angle at the x-axis $\theta_{a-x}$, an acceptance angle at the z-axis $\theta_{a-z}$, a length of the rear surface $L_{PV}$, a width of the rear surface $W_{PV}$, a trial entrance diameter $d_1$, an index of refraction of the dielectric n and a number of extreme rays N.

The width of the rear surface $d_o$ for a 2-D cross sectional design is provided, for example, to match the size of a photovoltaic cell in a solar based system, together with an increment $\Delta d_0$ of the width of the rear surface. From the value of the two acceptance angles $\theta_{a-x}$ and $\theta_{a-z}$, a value of an increment in the acceptance angle $\Delta\theta_a$ can also be assigned by the designer. The designer decides the minimum and maximum acceptance angle value. The increment of the acceptance angle will be a linear increment from the x and z axis calculated based on a desired resolution.

Figure 5:
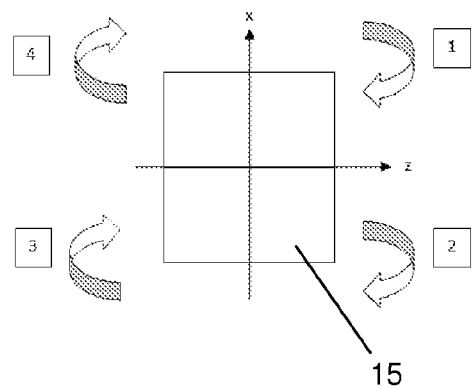
FIG. 5 a view of a rear surface of the optical element of FIG. 1 that illustrates division of the optical element into sections.

The rear surface 15 is illustrated as a square in FIG. 5. The rear surface 15 is divided into regions 1 to 4, which are bounded by the x and z axes. On the x-axis, the maximum value of the acceptance angle is limited to the value of $\pm\theta_{a-x}$ while the maximum acceptance angle on the z-axis is governed by the value of $\pm\theta_{a-z}$. If the value of $\theta_{a-x}$ is smaller than $\theta_{a-z}$, the value of the initial trial acceptance angle $\theta_a$ will be increased by $\Delta\theta_a$ for generation of successive cross sectional profiles lying in regions 1 and 4, while the value of $\theta_a$ for generation of successive cross sectional profiles lying in regions 2 and 3 will be successively decreased by $\Delta\theta_a$. The opposite will happen if the value of $\theta_{a-x}$ is greater than $\theta_{a-z}$, where the value of $\theta_a$ in regions 1 and 4 will be decreased by $\Delta\theta_a$ and the value of $\theta_a$ in regions 2 and 3 will be increased by $\Delta\theta_a$.

In this way, the acceptance angle is calculated for each increment $\Delta\theta_a$ and an associated exit diameter calculated, for example, using pythagoras' theorem (Step 1010).

A first 2-D cross section of a totally internally reflecting profile 35a is determined based on the initial variables input by a designer, with the initial acceptance value being set equal to the acceptance angle at x-axis ($\theta_{a-x}$). A trial height is generated, which is later used to calculate the coordinates of the faces 30a, 30b of the intermediate structure 20 (step 1020). Preferably, this is done using the phase conservation method but optionally may be done using the maximum concentration method. This calculation takes into account the number of extreme rays entering the concentrator at the critical angle. The cross sectional profile is generated point-by-point using ray tracing (step 1025). It begins with an extreme ray at P3 (as shown in FIG. 1) and ends with the extreme rays entering the edge of the entrance aperture at P1 (as shown in FIG. 1). At the start of the process, the designer selects a number of points needed to generate the cross sectional profiles. Based on the number of points needed, each point will be associated with an extreme ray to generate one side wall of the cross sectional profile with the same number of points. The other side wall will be the mirror image of the calculated side wall. From here, a trial entrance diameter (length of P1 to P1') can be straightforwardly generated. Once this is generated, the trial entrance aperture diameter is compared with the calculated entrance aperture diameter (step 1030). The initial trial entrance aperture diameter is input by the designer (e.g. as an arbitrary or estimated value) and the subsequent trial diameters are generated using the output diameter from a previous iteration, i.e. by using the phase conservation or maximum concentration method. If the difference between the calculated and trial entrance apertures is greater than a preset error value, a new entrance aperture diameter is computed from the difference between the trial/input entrance aperture diameter and the determined entrance aperture diameter (step 1035). A new cross section 35a of the optical element 5 based on the new entrance diameter is determined.

Figure 6:
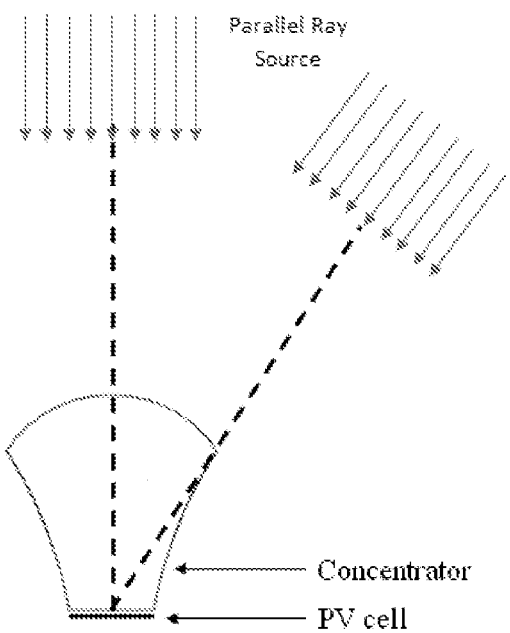
FIG. 6 shows a schematic of a simulated arrangement used in a ray-tracing process.

A number of iterations take place by using the difference between the input parameters and the parameters generated using the ray tracing methods, as illustrated by FIG. 6, as the input to a new iteration of the design of the cross section 35a until the difference between the entrance aperture is within an acceptable error value. Alternative and/or additional criteria for determining an acceptable entrance aperture include when the distance between the lower part of the profile and the edge of the exit aperture diameter are within an acceptable error value and/or until the distance between the edge of the entrance aperture diameter and the beginning of the front surface arc angle (in a cross-sectional view) are within an acceptable error value.

If the trial entrance aperture is within an acceptable error value of the calculated entrance aperture, the calculated total height of the concentrator is then compared with the desired total height (step 1040). The total height is adjusted by varying the front surface arc angle until the difference between the total heights is within a predetermined threshold (step 1045). Once the difference between the calculated total height and the desired total height is within the predetermined threshold, the 2D profile is stored for incorporation in the final 3D model (1045).

The process is repeated (step 1050) to get the next 2-D design, with each 2-D being computed by incrementing or decreasing the acceptance angle and the exit diameter accordingly using the value of $\Delta\theta_a$ and $\Delta d_0$ respectively, depending on which quadrant it is in, as shown in FIG. 5. The simulation stops when a 180° rotation around the y-axis is completed (step 1055).

Figure 7:
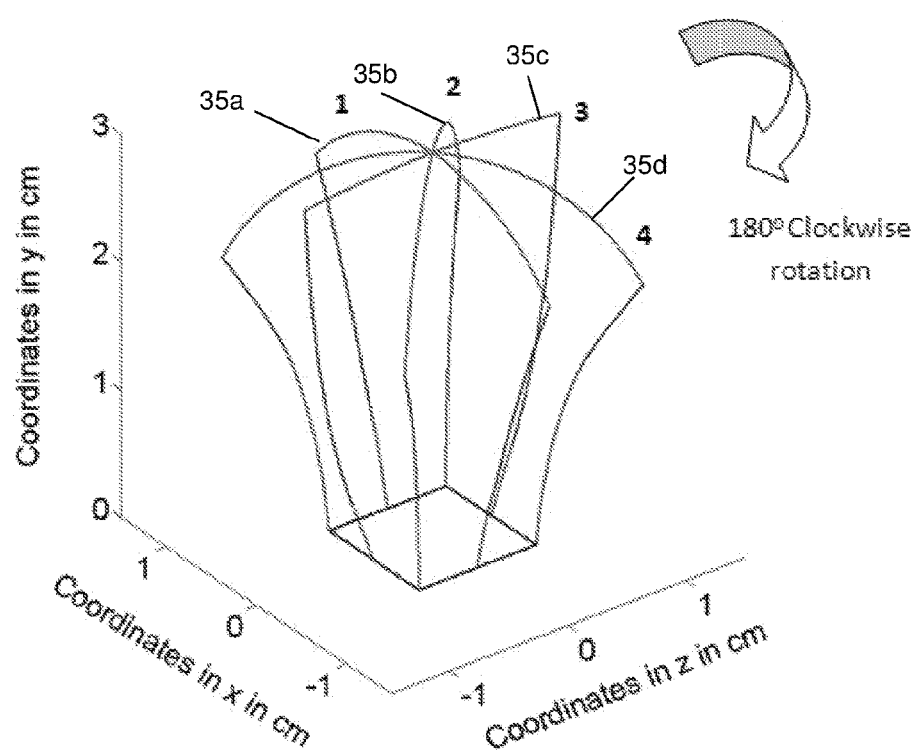
FIG. 7 shows the rotational relationship between a plurality of differing cross sections of the optical element of FIG. 1.
Figure 8A:
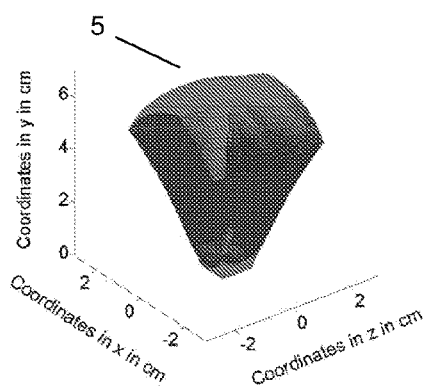
FIGS. 8(a) to 8(d) show an embodiment of an optical element according the invention.
Figure 8B:
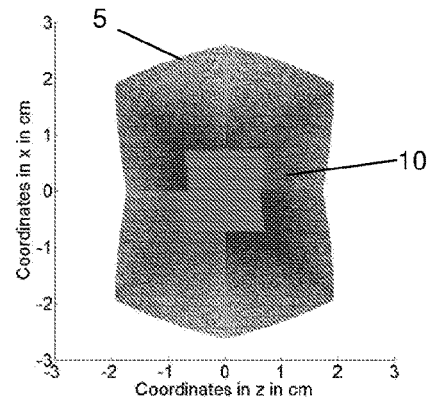
Figure 8C:
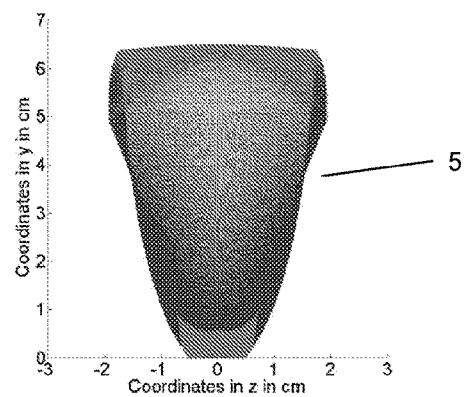
Figure 8D:
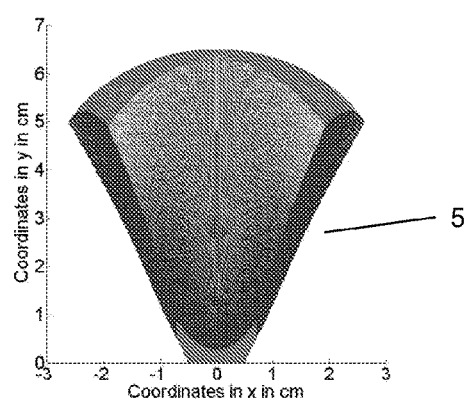
Figure 9A:
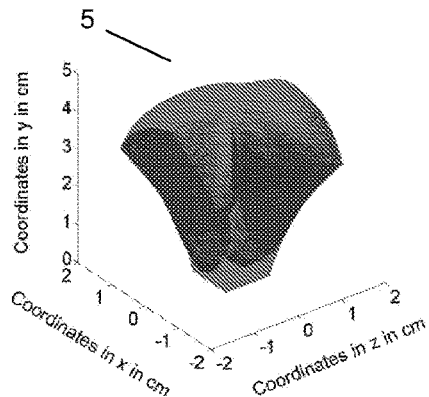
FIGS. 9(a) to 9(d) show a further embodiment of an optical element according the invention.
Figure 9B:
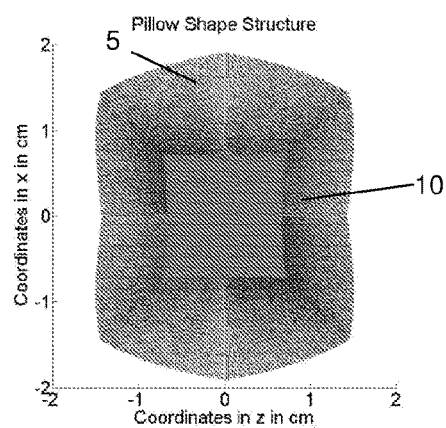
Figure 9C:
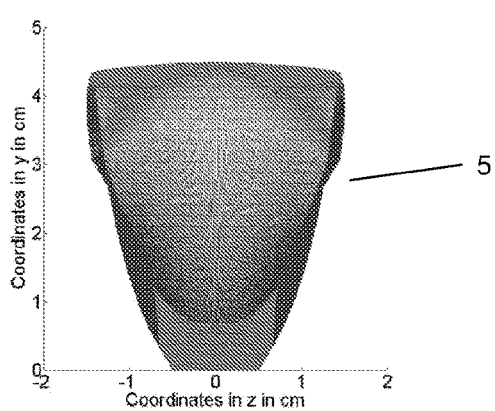
Figure 9D:
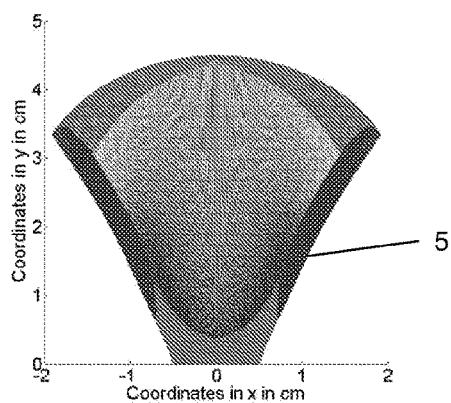
Figure 10A:
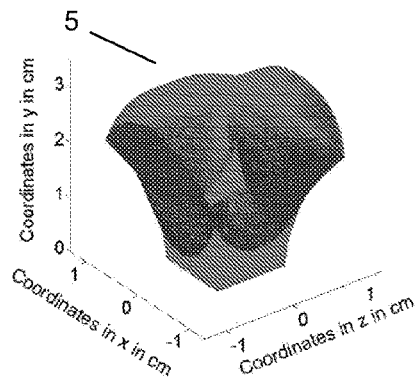
FIGS. 10(a) to 10(d) show another embodiment of an optical element according the invention.
Figure 10B:
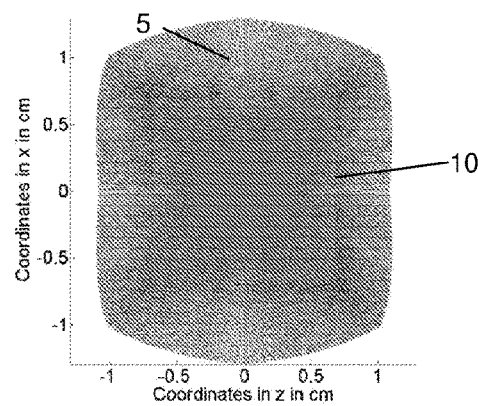
Figure 10C:
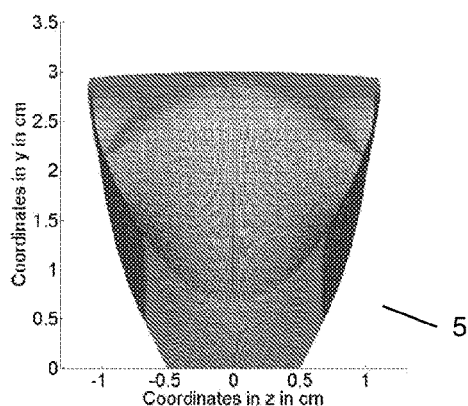
Figure 10D:
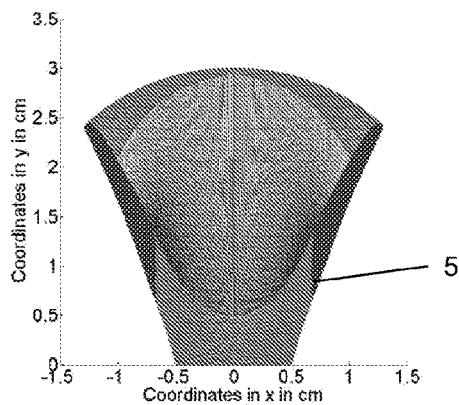

FIG. 7 illustrates the generation steps required to produce the varying cross sectional profiles 35a, 35b, 35c, 35d of the optical element 5, starting from plane 1 and rotating the cross section axis around the y-axis in steps through planes 2 and 3 until plane 4 is reached. A new cross sectional profile 35a, 35b, 35c, 35d of the optical element is determined for each plane. In this example, four different cross sectional profiles 35a, 35b, 35c, 35d are generated for ease of illustration, but it will be appreciated that any number of cross sections such as 2, 3 or more cross sections may be determined. In each rotational position, a different 2-D cross sectional profile 35a, 35b, 35c, 35d of the optical element 5 is generated, wherein each cross sectional profile 35a, 35b, 35c, 35d has a different front surface 10 arc angle φ.

EXAMPLES

In a specific example, the trial front surface 10 arc angle φ is selected to be 30°, the dimension of the PV cell is chosen to be 1 cm×1 cm, the trial length of the entrance apertured$_1$ is chosen to be 3 cm and the number of extreme rays N is selected to be 200. It will be appreciated that these represent arbitrary starting points for the iterative process and may be varied.

FIGS. 8(*a*) to (*d*), FIGS. 9(*a*) to (*d*) and FIGS. 10(*a*) to (*d*) show examples of optical elements 5 generated by the above process. The optical element 5 in each case is symmetrical in the x and z-axes. Each optical element 5 is presented from different angles; from a perspective view in FIGS. 8(*a*), 9(*a*) and 10(*a*); from the top, looking down through the front surface 10 in FIGS. 8(*b*), 9(*b*) and 10(*b*) and two different sides in FIGS. 8(*c*), 8(*d*), 9(*c*), 9(*d*), 10(*c*) and 10(*d*).

The optical element 5 shown in FIGS. 8(*a*) to (*d*) was generated by selecting the total height HTot to be 6.5 cm, the acceptance angle $\theta_{a-x}$ in the x-axis being selected to be 15°, the acceptance angle $\theta_{a-z}$ in the z-axis being chosen to be 25° and the refractive index n of the dielectric material from which the optical element is constructed is selected to be 1.5.

The optical element 5 shown in FIGS. 9(*a*) to (*d*) was generated by selecting the total height HTot to be 4.5 cm, the acceptance angle $\theta_{a-x}$ in the x-axis being selected to be 20°, the acceptance angle $\theta_{a-z}$ in the z-axis being chosen to be 30° and the refractive index n of the dielectric material from which the optical element is constructed is selected to be 1.5.

The optical element 5 shown in FIGS. 10(*a*) to (*d*) was generated by selecting the total height HTot to be 3.0 cm, the acceptance angle $\theta_{a-x}$ in the x-axis being selected to be 30°, the acceptance angle $\theta_{a-z}$ in the z-axis being chosen to be 40° and the refractive index n of the dielectric material from which the optical element is constructed is selected to be 1.5.

In this way, it can be seen that varying optical elements 5 having the same general structure and functional effect can be produced to suit different operational requirements.

The optical elements 5 of the present invention are designed to achieve different acceptance angles $\theta_a$ in different cross sectional planes and also to have a predetermined total height. Hence, to achieve the first objective, the value of acceptance angle $\theta_a$ and the exit diameter $d_o$ will change for every iterative rotation about the y-axis. To adjust the total height, the front surface 10 arc angle is varied to achieve the desired height.

It is not possible to see the direct relation between the optical gain and the front surface 10 arc angle φ, as well as the acceptance angle $\theta_a$ of the optical element 5. The optical element 5 uses a range of acceptance angles $\theta_a$ in one design and the arc angle φ varies throughout the surface of the front surface 10. The optical element's cross sections 35a, 35b, 35c, 35d are based on a dielectric total internally reflecting design; hence the gain of each 2D cross section is inversely proportional to both the arc angle φ and the acceptance angle $\theta_a$. By having a higher acceptance angle $\theta_a$, the total height of the optical element 5 will be reduced greatly. Therefore, any combination of total height and acceptance angle $\theta_a$ will need to satisfy this property. However, due to the large number of parameters required, the optical element 5 is limited in the number of designs that can be generated.

Figure 11A:
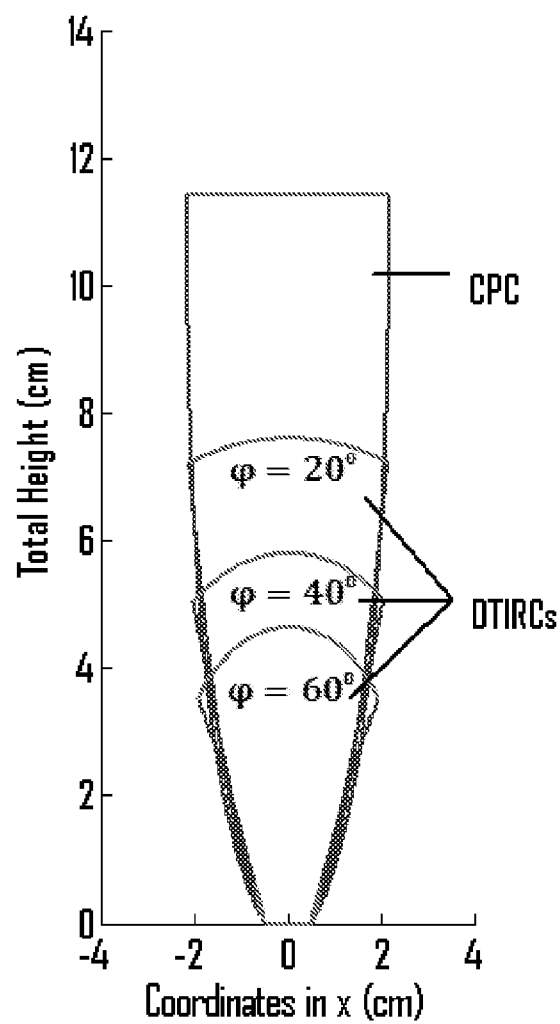
FIG. 11a shows cross sectional profiles of an optical element according to an embodiment of the invention with differing front surface arc angles and heights but having the same acceptance angle.
Figure 11B:
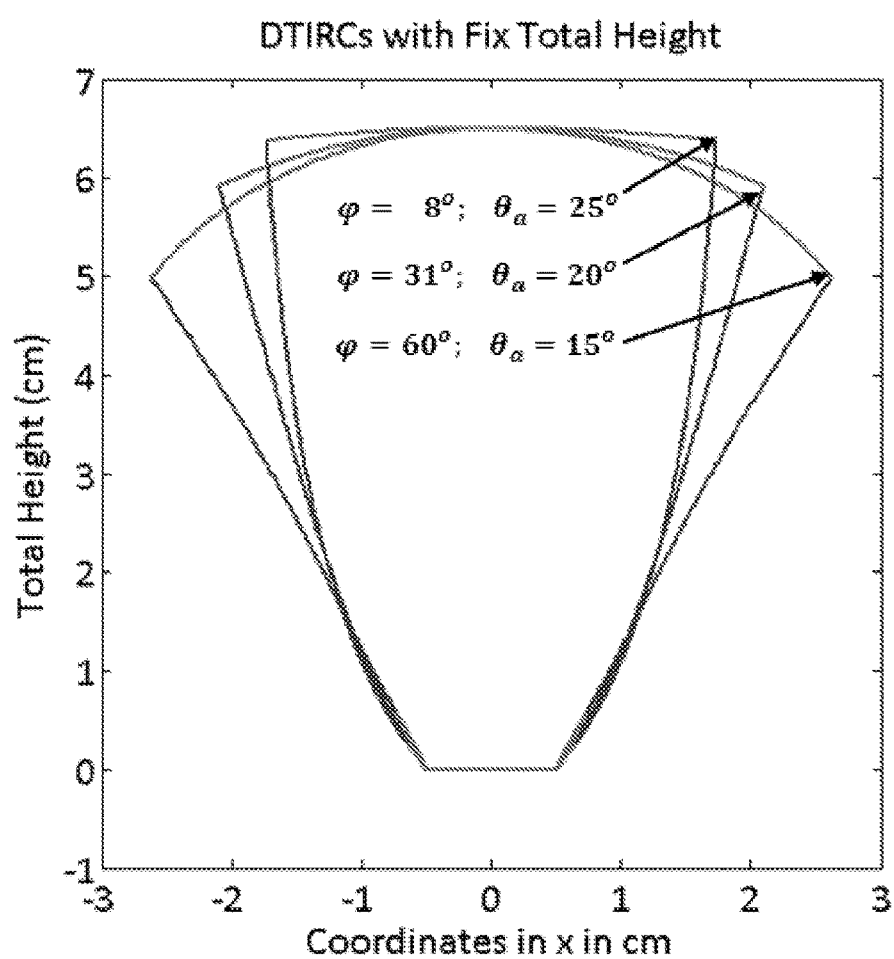
FIG. 11b shows cross sectional profiles of an optical element according to an embodiment of the invention with differing front surface arc angles and acceptance angles but the same height.

For example, if a specified acceptance angle is required, then a range of designs of cross sections for optical elements according to the present invention can be produced having varying heights and front surface arc angles, as shown in FIG. 11a. Conversely, a fixed height can be specified and cross sections of optical elements according to the present invention can be produced wherein the acceptance angle and front surface arc angle vary, as shown in FIG. 11b.

The present inventors have found that the non-rotationally symmetric optical elements 5 offer performance over a wide range of acceptance angles $\theta_a$. Instead of choosing one specific acceptance angle $\theta_a$, the present invention enables the system to achieve a range of acceptance angles $\theta_a$, with minimal compromise on performance. The non-rotationally symmetric optical elements 5 are able to achieve high gain, which may be in part due to the non-uniform surface of the front surface 10, which gives an increased surface area to capture more light.

The optical elements 5 according to the present invention can be used effectively as a concentrator in solar based system. The optical elements 5 of the present invention are capable of increasing the geometrical concentration gain, as well as providing different acceptance angles in different planes.

The optical elements 5 as described above are usable in a wide variety of applications, particularly as an optical concentrator, in systems such as solar energy systems, solar lighting systems, that harvest sunlight and channel it for lighting in rooms of a house, or solar heaters, furnaces, processors or the like. The optical element 5 may also be used in reverse, receiving light at the rear surface and outputting dispersed light over a wide area from the front surface.

Figure 12:
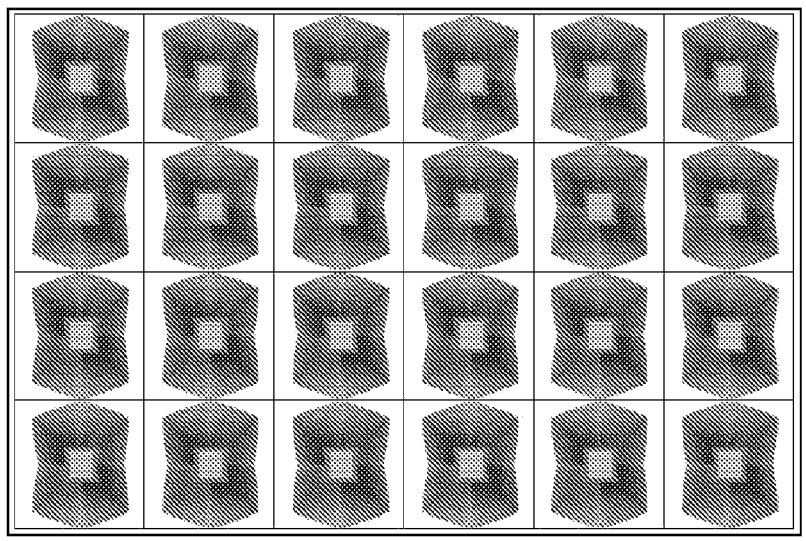
FIG. 12 shows a solar module comprising a plurality of optical elements according to aspects of the invention.
Figure 13:
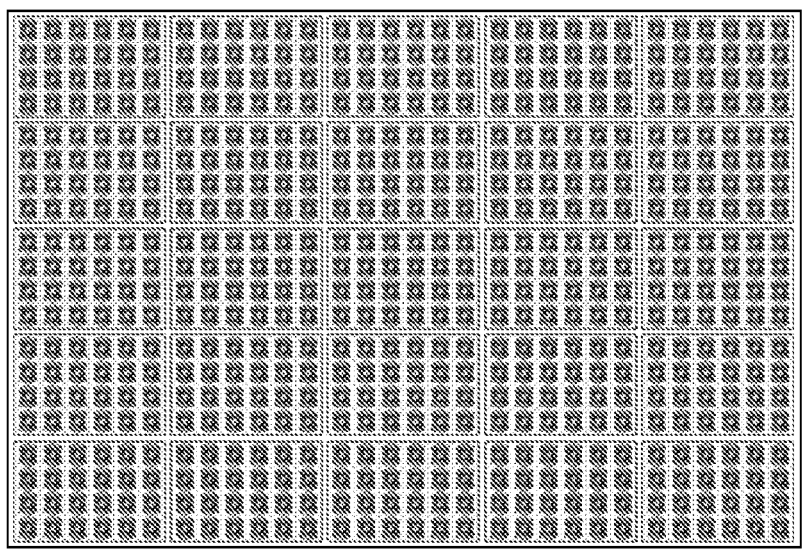
FIG. 13 shows an array of the solar modules as shown in FIG. 12.

For example, the optical elements 5 described above may be particularly advantageously used as concentrator elements for solar radiation in a photovoltaic apparatus such as that described in WO2010/026415. In this case, the optical elements 5 of the present invention may be provided with a photovoltaic cell at the rear surface of the optical element 5, wherein the photovoltaic cell is of identical or similar size to the rear surface. In this way, the optical element acts to collect solar radiation that is incident on the larger front surface 10 and concentrates the solar radiation on the photovoltaic cell located at the smaller rear surface 15 to thereby increase the performance of the photovoltaic cell and/or allow the size of the photovoltaic cell to be reduced. A solar module comprising a matrix of optical concentrators according to the present invention can be provided, as shown in FIG. 12. Furthermore, a photovoltaic array of such solar modules can be provided, as shown in FIG. 13. Optionally, a mirrored surface is provided between each optical element 5 to reflect radiation away from the side surfaces of the optical element. In this way, light which would impinge on the side surface of an optical element 5 rather than the front surface 10 may be reflected to the front surface 10 of an adjacent optical element 5 in the array. Optionally, the system can be configured such that light which impinges on the front surface 10 at an angle outwith the acceptance angle (i.e. is not subsequently totally internally reflected), can pass through the intermediate structure 20 of the optical element 5 and be used for ambient lighting. The photovoltaic cell can be provided with or in proximity to cooling fluid for extracting heat from the photovoltaic cell. The heated fluid can then be used to provide heating or may be used to heat water for domestic use or, if the fluid is water, may be used directly as domestic hot water.

The optical elements 5 of the present invention provide a range of potential advantages over prior art concentrators. As can be seen above, optical elements 5 according to the present invention are capable of providing a high gain. Furthermore, the optical elements 5 of the present invention have a large front surface 10 due to the non uniform structure of the surface area of the front surface 10, which is able to capture more sunlight and hence produce higher gain.

The optical elements 5 of the present invention can be configured to have a different acceptance angle for different cross sectional planes. The sun path will vary throughout the year, especially between summer and winter. To increase the performance of systems that collect solar energy, tracking systems are needed to track the sun movement. The tracking system is often expensive to implement. When optical elements 5 of the present invention are used as concentrators in such systems, the optical element 5 can provide a wide range of acceptance angles, which may eliminate or reduce the tracking needs, and may therefore be more favourable for static solar devices. Due to the high gain, photovoltaic systems utilising the optical elements 5 of the present invention as optical concentrators may require a smaller area of photovoltaic cell for the same amount of energy produced, thereby minimising costs, or may produce more energy with a same sized photovoltaic cell.

The optical elements 5 of the present invention have a non-uniform front surface 10 and may have two axes of symmetry, namely the x-axis and the z-axis, where, the y-axis is the longitudinal axis of the optical element 5 or the axis centrally running through the front surface 10 and the rear surface 15. The optical elements 5 of the present invention may offer high gain, the option of different fields of view for different planes and optionally utilizes only a small area of photovoltaic cell.

It should also be noted that whilst the accompanying claims set out particular combinations of features described herein, the scope of the present invention is not limited to the particular combinations hereafter claimed, but instead extends to encompass any combination of features or embodiments herein disclosed irrespective of whether or not that particular combination has been specifically enumerated in the accompanying claims at this time.

For example, two techniques, the phase conservation method and the maximum concentration method have been provided for generating cross sectional profiles 35a, 35b, 35c and 35d of the optical element. However, it will be appreciated that variations on these methods and/or alternative techniques that result in a total internal reflection of incident light may be used.

Some examples of materials from which the optical element 5 may be formed have been described. However, it will be appreciated that other substantially optically transparent materials may be used.

The optical elements 5 described above are advantageously useable as concentrators in a solar based system. However, it will be appreciated that the optical elements may be used for other applications that require collection, harvesting and/or concentration of light. For example, the concentrating effects of the optical element may be used in order to increase the detected signal in a sensor or detector system. The optical element may also be used as a beam shaper in an optical transmitter. The optical element may be used in reverse, by receiving light at the second/rear surface and projecting it from the first/front surface in order to act as a light dispersing element in an optical projector or transmitter system. The optical element may be used to couple light into a light pipe. An array of optical elements may be provided in order to generate pixels in an optical imaging or display system. The optical element may be used in place of the optical elements described in WO2010026415 in any of the applications described in WO2010026415, for example, in heating, such as space heating, and/or building ventilation. In general, it will be appreciated that the optical elements as described above may be used in any application that requires optical concentration or increasing collection or sensitivity of radiation. It will also be appreciated that the optical elements described above may be used in reverse in any application requiring dispersion of light, for example in conjunction with one or more LEDs in order to distribute the light throughout a room.

Similarly, although reference is made to front and rear surfaces or entrance and exit apertures, it will be appreciated that the optical element may be used in reverse, with light supplied to the rear surface 15 and exiting the optical element 5 via the front surface 10. In this case, the optical element may be operable as a light dispersing element or as a collimating element, for example, to emit the light from sources such as LEDs with a specific pattern or a variety of coloured patterns. This may find application, for example in replacing emissive light sources in applications such as lighting or in television screens or general LED displays.

Although it is described above that a silicon based photovoltaic material is provided at the output (second surface) of the optical element, it will be appreciated that any other photovoltaic material may be used, such as gallium arsenide. Indeed, depending on the application, the material at the output need not even by a photovoltaic material. For example, in sensor or detector applications, a CCD or CMOS device or even photographic paper or photochromic materials may be provided. It will also be appreciated that other material may be provided dependent on the application.

It will be appreciated that some aspects or embodiments described above may be carried out on or using a suitable computer and/or processing apparatus, which may comprise a processor and/or memory.

The invention claimed is:

1. An optical element having a first surface comprising a plurality of sectors defined by centrally radiating peaks and troughs, a second surface, and a side wall structure between the first and second surfaces, wherein the side wall structure has an internally reflecting profile having a curvature such that optical radiation incident on the first surface occurs at an angle less than or equal to an acceptance angle relative to an axis passing through the centres of the first surface and the second surface, and the optical radiation that is then incident on the side wall structure is internally reflected to the second surface by the side wall structure, wherein, in a first cross section that lies along the axis passing through the centres of the first and the second surfaces of the optical element, the side wall structure has a first internally reflecting profile and the first surface has a first cross sectional profile, and in a second cross section that lies along the axis passing through the centres of the first and the second surfaces of the optical element, the second cross section being rotated relative to the first cross section about the axis passing through the centres of the first and the second surfaces of the optical element, the side wall structure has a second internally reflecting profile and the first surface has a second cross sectional profile, wherein the second internally reflecting profile of the side wall structure and the second cross sectional profile of the first surface are different from the first internally reflecting profile of the side wall structure and the first cross sectional profile of the first surface, respectively, wherein an acceptance angle of the optical element in the first cross section differs from the acceptance angle of the optical element in the second cross section, and wherein a curvature or a height of the first surface in the first cross section is different from at least one of a curvature or a height of the first surface in the second cross section.

2. An optical element according to claim 1, wherein at least one of:
the first surface is convex or lenticular;
the optical element is non-rotationally symmetric; or
the second surface is square.

3. An optical element according to claim 1, wherein at least one of:
the first surface is configured to refract optical rays that are incident on the first surface to the side wall structure;
or
the optical element comprises a plurality of subsequent cross sections of the optical element, wherein for each subsequent cross section, the side wall structure has a totally internally reflecting profile or a first surface profile that is different from the totally internally reflecting profile or first surface profile of at least two other cross sections of the optical element.

4. An optical element according to claim 1, wherein:
each side wall profile of each cross section comprises at least a first portion closer to the first surface and a second portion closer to the second surface,
the first portion is of a first form or described by a first function and the second portion is of a second form or described by a second function that differs from the first form or function;
the first and second portions are continuous with each other; and
the first portion is shaped such that optical rays that are incident on the first surface at the acceptance angle and subsequently impinge on the first portion are directed to a peripheral or edge point on the second surface after a single total internal reflection from the first portion.

5. A method of generating an optical element, the optical element having a first surface that comprises a plurality of sectors defined by centrally radiating peaks and troughs, a second surface, and a side wall structure between the first and second surfaces, wherein the side wall structure has an internally reflecting profile having a curvature wherein optical radiation incident on the first surface occurs at an angle less than or equal to an acceptance angle relative to an axis passing through the centres of the first surface and the second surface, and the optical radiation that is subsequently incident on the side wall structure is totally internally reflected to the second surface by the side wall structure and the method comprises:
determining a first internally reflecting profile of the side wall structure and a first cross sectional profile of the first surface in a first cross section that lies along the axis passing through the centres of the first and the second surfaces of the optical element;
determining a second internally reflecting profile of the side wall structure and a second cross sectional profile of the first surface in a second cross section that lies along the axis passing through the centres of the first and the second surfaces of the optical element, the second cross section being rotated relative to the first cross section about the axis passing through the centres of the first and the second surfaces of the optical element; and
producing an optical element with the determined first surface and side wall structure,
wherein:
the first internally reflecting profile of the side wall structure and the first cross section of the first surface are different to the second internally reflecting profile of the side wall structure and the second cross section of the first surface, respectively;
an acceptance angle of the optical element in the first cross section differs to the acceptance angle of the optical element in the second cross section; and
a curvature or a height of the first surface in the first cross section is different from at least one of a curvature or a height of the first surface in the second cross section.

6. An optical element according to claim 1, wherein at least one of:
the optical element comprises four quadrants, wherein each quadrant is a mirror image in one of two orthogonal axes of another quadrant; or
the optical element has two axes of mirror symmetry along an x-axis and a z-axis, where, a y-axis is a longitudinal axis of the optical element or the axis centrally running through the front surface and the second surface; or
the optical element is solid.

7. An optical element according to claim 1, wherein the first surface further comprises
one or more curve intersections.

8. An optical element according to claim 4, wherein:
the second portion is shaped such that optical rays that are incident on the first surface within the acceptance angle and that subsequently impinge on the second portion are directed to the second surface; and
either the second portion is shaped such that the optical rays exit from the second surface in parallel or the second portion is shaped such that optical rays that are incident on the first surface within the acceptance angle and that subsequently impinge on the second portion of the side wall profile are directed to the second surface such that all optical rays experience a single total internal reflection before arriving at the second surface.

9. An optical element according to claim 1, wherein:
the second portion is shaped such that optical rays that are incident on the first surface within the acceptance angle and that subsequently impinge on the second portion are directed to the second surface; and either the second portion is shaped such that the optical rays exit from the second surface in parallel or the second portion is shaped such that optical rays that are incident on the first surface within the acceptance angle and that subsequently impinge on the second portion of the side wall profile are directed to the second surface such that all optical rays experience a single total internal reflection before arriving at the second surface.

10. An optical element according to claim 1, wherein the optical element is a solid optical element having an external profile defined by the first surface that comprises the plurality of sectors defined by peaks and troughs and by the second surface and the side wall structure that extends between the first and the second surfaces.

* * * * *